(12) United States Patent
Chouinard et al.

(10) Patent No.: US 9,118,601 B2
(45) Date of Patent: Aug. 25, 2015

(54) LAYER 2 AND 3 LATCHING LOOPBACKS ON A PLUGGABLE TRANSCEIVER

(71) Applicant: JDS Uniphase Corporation, Milpitas, CA (US)

(72) Inventors: Luc Chouinard, Ottawa (CA); David George Coomber, Nepean (CA); Richard Charles Vieregge, Ottawa (CA); Emmanuelle Marie Josèphe Janz, Dunrobin (CA)

(73) Assignee: JDS Uniphase Corporation, Milpitas, CA (US)

( * ) Notice: Subject to any disclaimer, the term of this patent is extended or adjusted under 35 U.S.C. 154(b) by 305 days.

(21) Appl. No.: 13/783,871

(22) Filed: Mar. 4, 2013

(65) Prior Publication Data

US 2013/0229927 A1    Sep. 5, 2013

Related U.S. Application Data

(60) Provisional application No. 61/606,800, filed on Mar. 5, 2012.

(51) Int. Cl.
*H04L 12/26* (2006.01)
*H04L 12/46* (2006.01)
*H04L 12/413* (2006.01)
(Continued)

(52) U.S. Cl.
CPC .............. *H04L 43/50* (2013.01); *H04L 12/413* (2013.01); *H04L 12/46* (2013.01); *G01R 31/31716* (2013.01); *H04L 12/40013* (2013.01)

(58) Field of Classification Search
CPC .......... G01R 31/31716; H04M 3/2254; H04Q 2213/13202; H04L 12/40013; H04L 43/50
See application file for complete search history.

(56) References Cited

U.S. PATENT DOCUMENTS 5,010,544 A * 4/1991 Chang et al. .................. 370/243
5,343,461 A   8/1994 Barton et al. .................. 370/13
(Continued)

FOREIGN PATENT DOCUMENTS

WO    22008041978    4/2008    ............. G06F 15/78

OTHER PUBLICATIONS

"MEF Technical Specification MEF x.0 Latching Loopback Protocol and Functionality" The Metro Ethernet Forum created 2009; amendments 2012.
(Continued)

*Primary Examiner* — Raj Jain
(74) *Attorney, Agent, or Firm* — Matthew A. Pequignot; Pequignot + Myers LLC

(57) ABSTRACT

A pluggable transceiver, and its use, looping back Layer 2 and higher data in an Ethernet network element. The transceiver has upstream and downstream datapaths, a logic array having first and second complimentary latching loopback logic blocks (LLBLBs) connected in series through both datapaths. The first LLBLB receiving an upstream datapath frame, comparing it to loopback conditions and looping back the frame on the downstream datapath if the conditions match. If the conditions did not match, the frame is sent to the other LLBLB. The first LLBLB receiving a frame from the second LLB and transmitting it on the upstream datapath with priority over any loop back frames to maintain the upstream throughput requirements of the pluggable transceiver. The second LLBLB operates in mirror image with respect to the datapaths.

17 Claims, 11 Drawing Sheets

(51) Int. Cl.
*G01R 31/317* (2006.01)
*H04L 12/40* (2006.01)

(56) References Cited

U.S. PATENT DOCUMENTS 5,365,485 A * 11/1994 Ward et al. ............... 365/189.15
5,784,558 A * 7/1998 Emerson et al. ............. 709/230
5,838,900 A * 11/1998 Horvath et al. ................ 714/56
6,477,674 B1 * 11/2002 Bates et al. ................... 714/738
8,345,703 B2 1/2013 Heinkel et al. ................ 370/419
2012/0301134 A1 11/2012 Davari et al. ...................... 398/9
2013/0229927 A1 * 9/2013 Chouinard et al. ........... 370/249
2014/0016479 A1 * 1/2014 Coomber et al. .......... 370/241.1

OTHER PUBLICATIONS

"Plug & Go™ Loopback—configuring the MetroNID™ to Respond to QT-600 Loopback Commands" Accedian Networks Version 1.1: Feb. 2010.

* cited by examiner

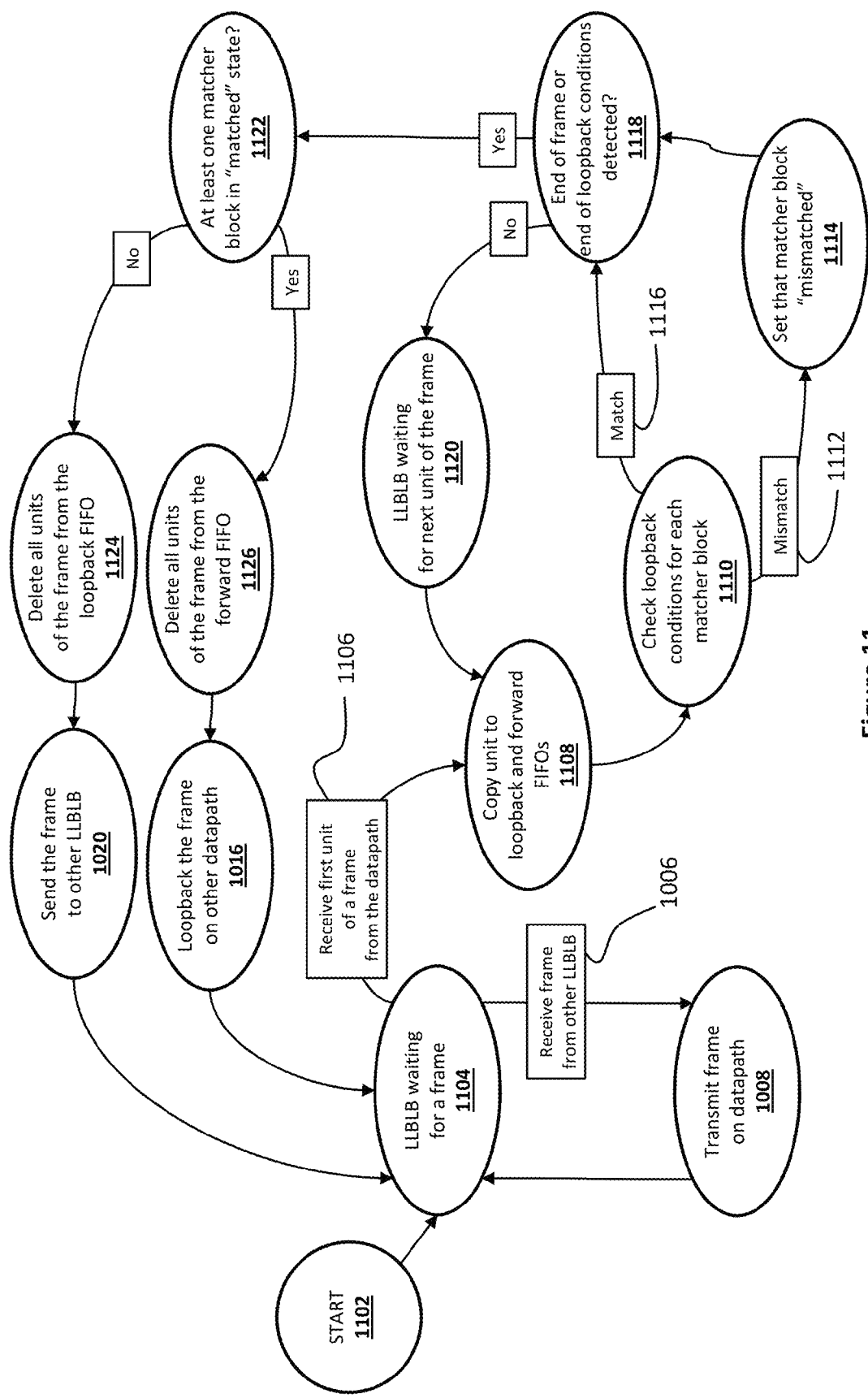

LAYER 2 AND 3 LATCHING LOOPBACKS ON A PLUGGABLE TRANSCEIVER

CROSS-REFERENCE TO RELATED APPLICATIONS

The present invention claims priority from U.S. Patent Application No. 61/606,800 filed Mar. 5, 2012, which is incorporated herein by reference.

TECHNICAL FIELD

The present invention relates to pluggable transceivers in communication networks and more particularly to adding layer 2 and layer 3 latching loopback functionality on a pluggable transceiver for use in existing network equipment.

BACKGROUND OF THE INVENTION

Communication Service Providers are deploying a large number of Ethernet and IP services across networks and across a large number of Network Equipment Manufacturers (NEMs).

The support for Ethernet test and turn-up functions such as latching loopback (LLB) functions differs largely from one network equipment provider to another and this dramatically increases the operational complexity of deploying Ethernet based services across networks and across equipment vendors.

Network Elements (NEs) in today's networks are owned and managed by many parties that have interests in different portions of the Ethernet networks. To support the different needs of these parties, different types of services are being deployed over these networks.

One type of service being deployed is Ethernet Virtual Connections (EVCs). EVCs are logical representations of Ethernet services as defined by associations between 2 or more physical interfaces. An EVC represents a logical relationship between Ethernet user-to-network interfaces (UNI) in a provider-based Ethernet service. EVCs may be deployed to differentiate traffic on Ethernet networks.

When a telecommunications service provider offers a Metro Ethernet service that is compliant with the Metro Ethernet Forum (MEF) specifications, the service has two basic elements: the UNI (User Network Interface) or ENNI (External Network to Network Interface) by which the service is provided to the customer, and an EVC that establishes a communication relationship between one or more UNIs or ENNIs. In Metro Ethernet services, there are three types of EVC: point-to-point, multipoint-to-multipoint and point-to-multipoint.

Another type of service being deployed over Ethernet networks consists of transporting traffic at different network layers such as Layer 2 (Ethernet frames) and Layer 3 (IP packets).

A key component of the Ethernet test and turn-up functions and performance monitoring capabilities is latching loopbacks. A latching loopback (LLB) is a function within a device in an Ethernet network where Ethernet frames, IP Packets and/or higher layer data are returned to the entity which sent them. It is advantageous to have latching loopbacks available at as many different points in the network as possible for testing purposes; however the latching loopbacks should not, or should minimally, interfere with regular operation of the network, its device and network traffic.

Various different LLB protocols have been, and are being defined, such as those by the MEF. Traditionally, LLB functionality was intended to be implemented by various carrier Ethernet equipment such as Network Interface Devices (NIDs), bridges, switches, and testing equipment.

Latching loopback functions are not always supported on all networking equipment; and when supported, they may not be implemented consistently across different equipment vendors. This makes it difficult to manage the Ethernet network with a single network management system. It would be advantageous to be able to manage all or a majority of a network and its many different NEs with a single network management system.

When latching loopback functions are not implemented inside existing networking equipment, external Network Interface Devices (NIDs) boxes can be inserted in-between NEs to enable latching loopback functions. NIDs have some disadvantages because they introduce extra equipment into the network requiring extra rack space, extra power, extra cost and the additional NIDs may also cause additional networking issues.

FIG. 1 illustrates how latching loopback functions may be implemented in prior art networks. In FIG. 1, heterogeneous NEs 2, 4, 6, 8 are connected in a network 100 such as by fiber optical cabling. The NEs 2, 4, 6, 8 have ports to receive transceivers 12 which provide electro-optical interfaces between NEs 2, 4, 6, 8 over the network 100. Some NEs are provided by some manufacturers, some by others. Some NEs have latching loopback capability 14 while some do not. Network Element NE_A 2 implements latching loopback functionality 14 internally; however a wide variety of LLB implementations across different NEs makes managing all the different LLB interfaces in the network 100 difficult.

None of network elements NE_B 4, NE_C 6 or NE_D 8 implement latching loopback functions internally. Accordingly, to implement latching loopback functions between these LLB-deficient NEs, additional devices, in the form of NIDs 16, 18 may be installed, where possible, into the network between network elements 2, 4, 6, 8 on each path.

In the example in FIG. 1, installing NIDs 16, 18 is possible between NE_B 4 and NE_C 6 because, for example, the network administrator has access to the cabling between those two NEs and can physically interrupt those lines, install and manage additional NIDs. However, in FIG. 1, there are no NIDs between NE_C 6 and NE_D 8 because, for example, NE_D 8 may be located in a constrained location 20 where no NIDs could be added. In many cases, certain parts of the Ethernet network 100 cannot be covered, or would be excessively difficult to cover with LLB by the addition of NIDs due to physical constraints, such as NEs that are poles. As a result, it is common for LLB to be unavailable in parts of the network 100. Although NE_A 2 and the NIDs 16, 18 implement LLB 14, it is common that they do not share the same management interface making managing all of the LLBs difficult and disconnected. It would be advantageous to have a simple, cost effective and unified way to add Layer 2, Layer 3 and higher layer latching loopback functionality on existing network equipments.

SUMMARY OF THE INVENTION

According to one aspect, a method for using a pluggable transceiver in a network element of an Ethernet network for looping back frames is disclosed. The transceiver has an upstream datapath, a downstream datapath and a logic array having a first latching loopback logic block (LLBLB) and a second LLBLB connected in series through both the upstream and downstream datapaths. The method comprises: (a) receiving, in the first LLBLB, a frame from the downstream datapath; (b) comparing, in the first LLBLB, the frame from (a) to first loopback conditions yielding a match or a mismatch; (c) in response to (b) yielding a mismatch, sending, in the first LLBLB, the frame from (b) to the second LLBLB; (d) in response to (b) yielding a match, looping back, in the first LLBLB, the frame from (b) on the upstream datapath if there is available bandwidth on the upstream datapath; (e) receiving, in the first LLBLB, a frame from the second LLBLB; (f) transmitting, in the first LLBLB, the frame from (e) on the upstream datapath; (g) receiving, in the second LLBLB, a frame from the upstream datapath; (h) comparing, in the second LLBLB, the frame from (g) to second loopback conditions yielding a match or a mismatch; (i) in response to (h) yielding a mismatch, sending, in the second LLBLB, the frame from (h) to the first LLBLB; and (j) in response to (h) yielding a match, looping back, in the second LLBLB, the frames from (h) on the downstream datapath if there is available bandwidth on the downstream datapath; (k) receiving a frame, in the second LLBLB, from the first LLBLB; (l) transmitting, in the second LLBLB, the frame from (k) on the downstream datapath.

According to another aspect, a pluggable transceiver for use in a network element of an Ethernet network for looping back frames is disclosed. The transceiver comprises a downstream datapath for relaying frames downstream through the transceiver; an upstream datapath for relaying frames upstream through the transceiver; a logic array connected through the upstream and downstream datapaths and comprising a first latching loopback logic block (LLBLB) and a second LLBLB connected in series through both the upstream and downstream datapaths. The first LLBLB has filter logic for receiving a frame from the downstream datapath and for comparing the frame from the downstream datapath to first loopback conditions yielding a match or a mismatch. The first LLBLB has a forwarding FIFO for sending the frame from the downstream datapath to the second LLBLB in response to the first LLBLB's filter logic yielding a mismatch. The first LLBLB has a loopback FIFO for looping back the frame from the downstream datapath on the upstream datapath if there is available bandwidth on the upstream datapath, in response to the first LLBLB's filter logic yielding a match. The first LLBLB has output logic for receiving a frame from the second LLBLB and transmitting the frame from the second LLBLB on the upstream datapath. The second LLBLB has a filter logic for receiving a frame from the upstream datapath and comparing the frame from the upstream datapath to second loopback conditions yielding a match or a mismatch. The second LLBLB has a forwarding FIFO for sending the frame from the upstream datapath to the first LLBLB in response to the second LLBLB's filter logic yielding a mismatch. The second LLBLB has a loopback FIFO for looping back the frames from the upstream datapath on the downstream datapath if there is available bandwidth on the downstream datapath, in response to the second LLBLB's filter logic yielding a match. And, the second LLBLB has an output logic for receiving a frame from the first LLBLB and transmitting the frame from the first LLBLB on the downstream datapath.

Where alternative embodiments and additional aspects of those embodiments are described in the present disclosure, these embodiments and aspects may be combined in any manner within a single embodiment unless the present disclosure suggests otherwise. While preferred embodiments may be illustrated or described herein, they are not intended to limit the invention. Rather, numerous changes including alternatives, modifications and equivalents may be made as would be understood by the person skilled in the art.

BRIEF DESCRIPTION OF THE DRAWINGS

The invention will be described in greater detail with reference to the accompanying drawings.

FIG. 11 is a logical flow diagram of another method of operation of a latching loopback logic block in a pluggable transceiver according to the present disclosure.

DETAILED DESCRIPTION

Traditional pluggable transceivers 12 are very small (e.g. small form-factor) and perform very limited functionality but have the advantage of being part of most existing networking equipment by most network equipment manufacturers. Pluggable transceivers 12 are pluggable in the sense that they are easily replaceable components that have a common and widely accepted physical interface on network equipment. Small form-factor pluggables (SFPs) are a popular industry format jointly developed and supported by many network equipment manufacturers and vendors. Enhanced small form-factor pluggable (SPF+) supports data rates up to 10 Gbit/s.

Pluggable transceivers 12 provide input and output interfaces between network elements like switches, routers, etc. and fiber optic cables. Some of these interfaces perform conversions between optical and electrical signals. Small form-factor pluggable (SFP) transceivers support communications standards including synchronous optical networking (SONET), synchronous digital hierarchy (SDH), gigabit Ethernet and fiber channel. They also allow the transport of fast Ethernet and gigabit Ethernet LAN packets over time-division-multiplexing-based WANs, as well as the transmission of E1/T1 streams over packet-switched networks. Other interfaces are purely electrical, for example copper SFPs that do not contain an optical-electrical conversion or use fiber optic cables.

Pluggable transceivers 12 typically follow a very detailed specification defined under industry MSAs (MultiSource Agreements). Pluggable transceivers are globally accepted by the networking community. Their small mechanical form factor and their simple interfaces are well defined. It would be advantageous to embed Layer 2, Layer 3 and higher Layer latching loopback functions on them without disturbing their primary requirements and functionalities as a pluggable transceiver.

Furthermore, programmable gate arrays such as FPGAs have decreased in physical requirements sufficiently that they can be included within a pluggable transceiver 12 without increasing their physical size and without substantially changing the throughput, power and heat dissipation requirements.

Figure 1:
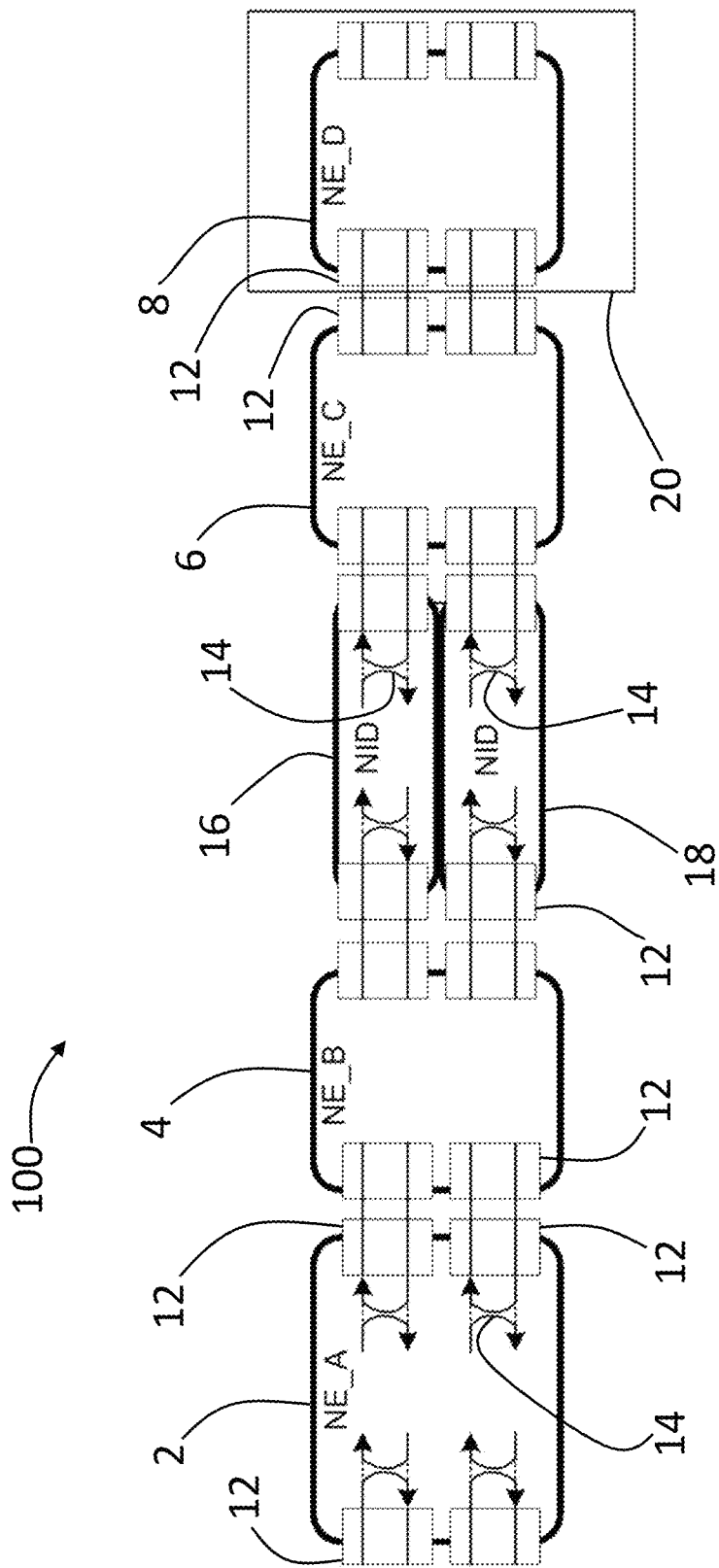
FIG. 1 is logical block diagram of a prior art network illustrating latching loopback functionality.
Figure 2:
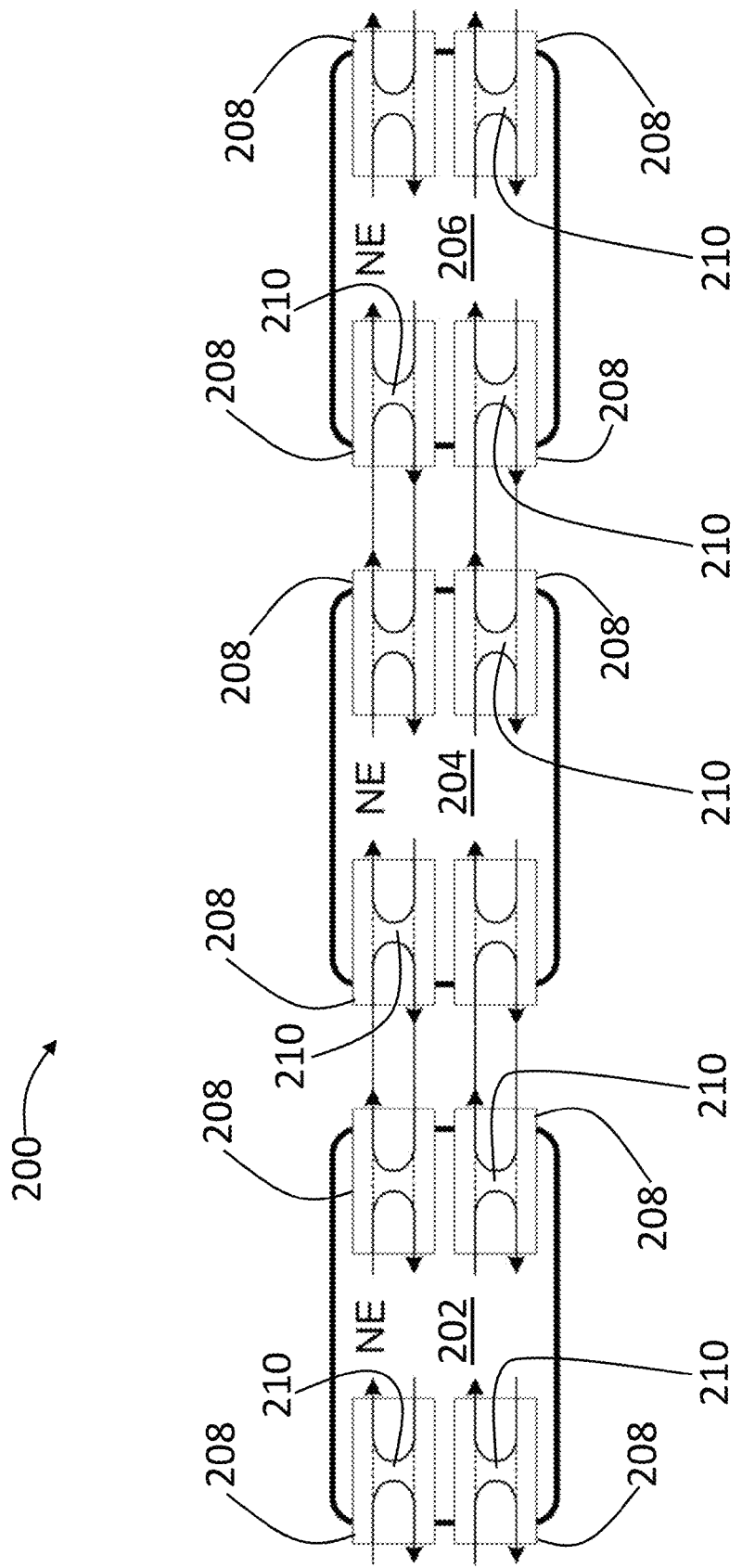
FIG. 2 is a logical block diagram of a network implementing pluggable transceivers according to the present disclosure.

Referring now to FIG. 2, an Ethernet network 200 is illustrated where heterogeneous network elements 202, 204, 206 each have pluggable transceiver ports which receive pluggable transceivers 208 in place of traditional pluggable transceivers 12. Similar to the NEs of FIG. 1, NEs 202, 204, 206 may be heterogeneous; that is, they may be made by different vendors and operated by different service providers so long as they can receive pluggable transceivers 12, 208.

The pluggable transceivers 208 internally implement Layer 2, Layer 3 and higher layer latching loopback functions 210 according to the present disclosure. The transceivers 208 can be SFPs, XFPs, SFP+, CFPs, QSFPs or any other format of pluggable transceiver so long as the FPGA technology becomes available. By adding logic arrays such as either FPGA or ASIC within the transceivers 208, more networking functions such as the latching loopback 210 can be added directly at the interfaces of any network element that receives pluggable transceivers.

The latching loopback functions 210 in the transceivers 208 add, complement, simplify and unify the overall system latching loopback functions on existing networks 200 that were built with networking equipments (NEs) not having unified LLB capability. Rather than replace each network element in an effort to provide LLB functionality, and rather than installing NIDs at all possible locations, transceivers 208 may replace traditional transceivers and concurrently provide LLB functionality.

Figure 3:
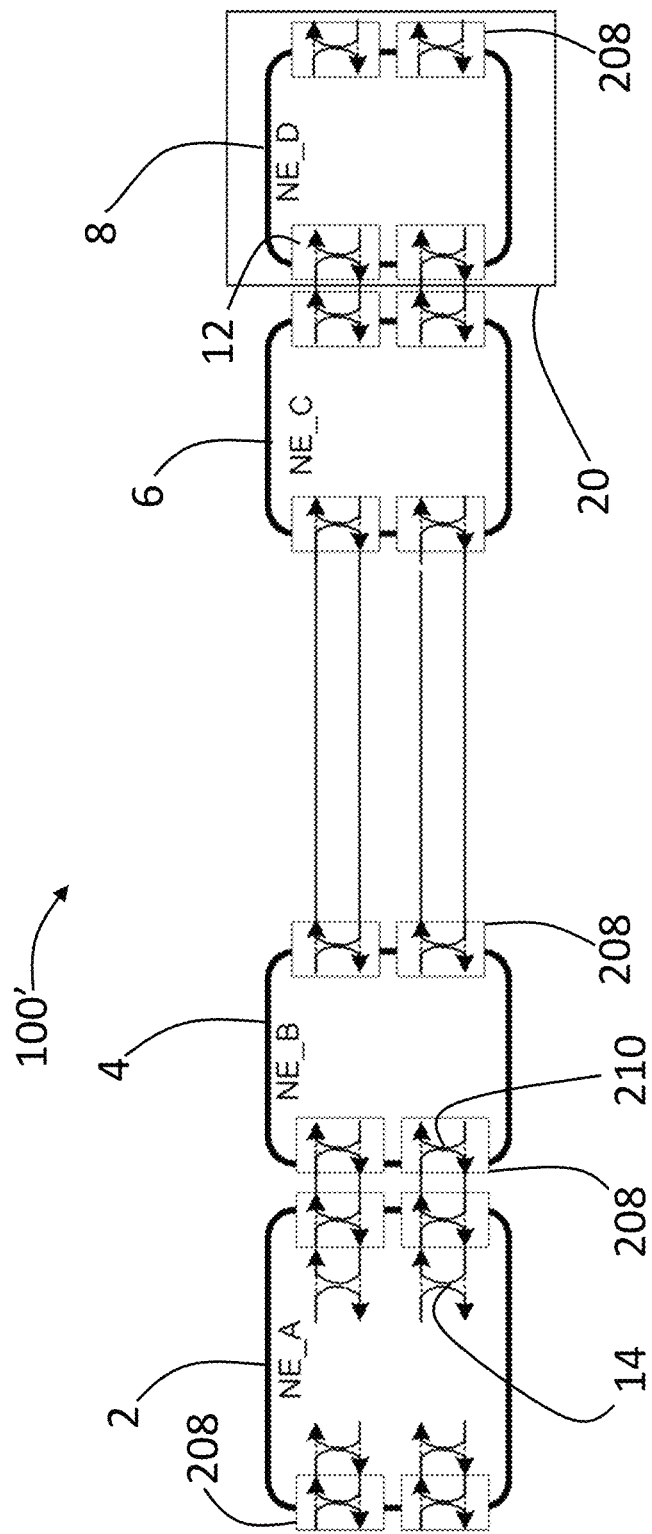
FIG. 3 is a logical block diagram of the network of FIG. 1 augmented with pluggable transceivers according to the present disclosure.

The costs and effort to replace an existing NE's pluggable transceivers with transceivers 208 with L2/L3 LLB capabilities are low compared to the costs and effort to replace, a whole NE with a new NE that has LLB capabilities. FIG. 3 illustrates the effects of replacing traditional transceivers 12 in network 100 of FIG. 1 with LLB-enabled transceivers 208 in the network 100'. All network elements 2, 4, 6 and 8 can now provide unified L2/L3 latching loopback functionality at all ports permitting monitoring, testing and turn-up of all segments of the network 100'. NIDs 16, 18 of network 100 have been rendered redundant and removed from the network 100' providing a savings in physical space (rack space), power consumption, heat generation, cabling and cable management in comparison to the requirements of transceivers 208. Even in constrained locations 20 it is possible for transceiver 208 to replaces transceiver 12 because the two transceivers 12, 208 have a common form factor. From a network administration perspective, there is very little change: there is no need to replace any of the NEs with different, LLB capable NEs; accordingly, there are no new NEs to configure and test in the network 100'.

Figure 4:
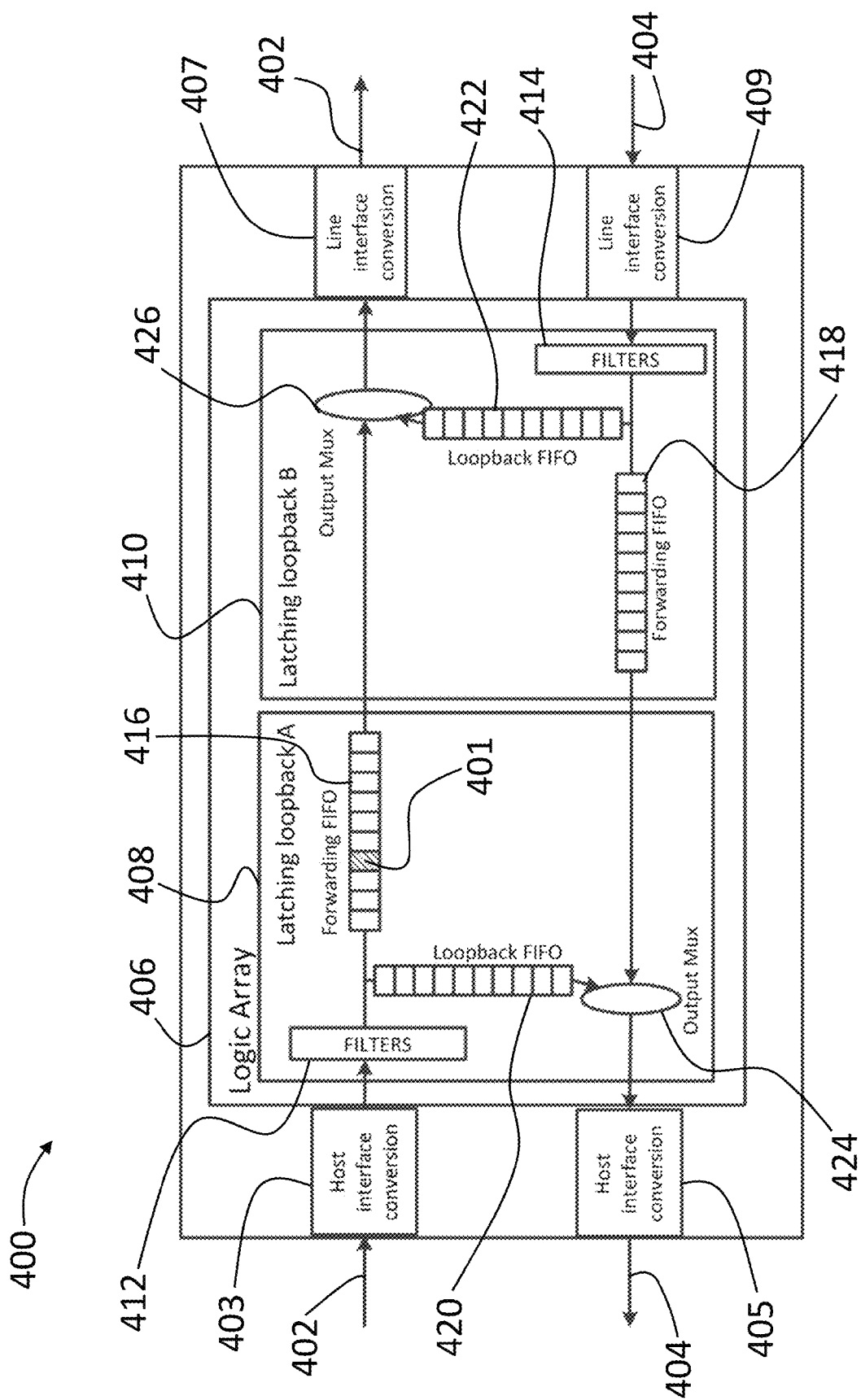
FIG. 4 is a logical block diagram of a pluggable transceiver according to the present disclosure.

Turning now to FIG. 4, a pluggable transceiver 400 for relaying L2 Ethernet frames in a packet based network with bi-directional latching loopback logic is illustrated in a block diagram. The pluggable transceiver 400 includes a downstream datapath 402 for relaying Ethernet frames downstream through the transceiver 400, an upstream datapath 404 for relaying Ethernet frames upstream through the transceiver, host interface converters 403, 405, line interface converters 407, 409 and a logic array 406, through which both datapaths 402, 404 pass.

The commonly understood host interface converters 403, 405 may perform some signal processing to serialize or deserialize data and other functions as well understood in the art of transceivers. On electro-optical transceivers, the commonly understood line interface converters 407, 409 perform optical to electrical and electrical to optical conversions as well understood in the art of transceivers. Depending on the configuration of the transceiver 208, 400 the electrical to optical and optical to electrical conversions may be performed on one or the other of the downstream or upstream data paths. The transceiver 400 may also be an electrical-electrical transceiver, in which case the line interface converters 407, 409 perform electrical to electrical conversions, if any are necessary. As described above, there may not be any electrical to optical conversions, as in the case of copper SFPs.

Pluggable transceivers are required to be transparent with regard to data passing from upstream to downstream or host to line and vice versa. They should also terminate or transparently pass data link negotiation protocols and must include MSA required identification and diagnostics.

In FIG. 4, "upstream" is arbitrarily defined in the left or host direction, while downstream is to the right or line direction. For consistency, this convention is maintained in the rest of the figures and the specification unless otherwise noted.

In FIG. 4, the Ethernet frames are not illustrated. Rather, an Ethernet frame passes through the logic array 406 in several uniform size pieces, referred to hereafter as units 401. Each unit may be any number of bits, but is generally, but not always, smaller than an entire Ethernet frame. In some embodiments each unit 401 is one byte in size; however some embodiments may have unit sizes of 2, 4, 8 or more bytes. In this specification, the operation of the pluggable transceiver 208, 400 is described in respect of Ethernet frames, which typically refer to a datum at the data link layer (layer 2) of the OSI Model; however, for simplicity of explanation in this specification, it should be understood that Ethernet frames includes higher layer data.

The pluggable transceiver 400 in FIG. 4 provides bi-directional latching loopback (LLB) functions at Layers 2 and up. Two latching loopback logic blocks 408, 410 are illustrated inside logic array 406 connected in series on the two data paths 402, 404. The downstream datapath 402 connects through host interface conversion 403, latching loopback logic A 408, latching loopback logic B 410 and then line interface conversion 407. Conversely, the upstream datapath 404 connects through line interface conversion 409, LLB logic B 410, LLB logic A 408 and then host interface conversion 405. Unless otherwise indicated, the two LLB logic blocks 408, 410 are mirror images of each other facing their respective upstream/downstream or host/line interfaces 403, 405, 407, 409.

The four key components of the LLB logic blocks 408, 410 are the filters 412, 414, the forwarding FIFO 416, 418, the loopback FIFO 420, 422 and the output multiplexer logic 426, 424. The functions of each of these components are now described.

Figure 5:
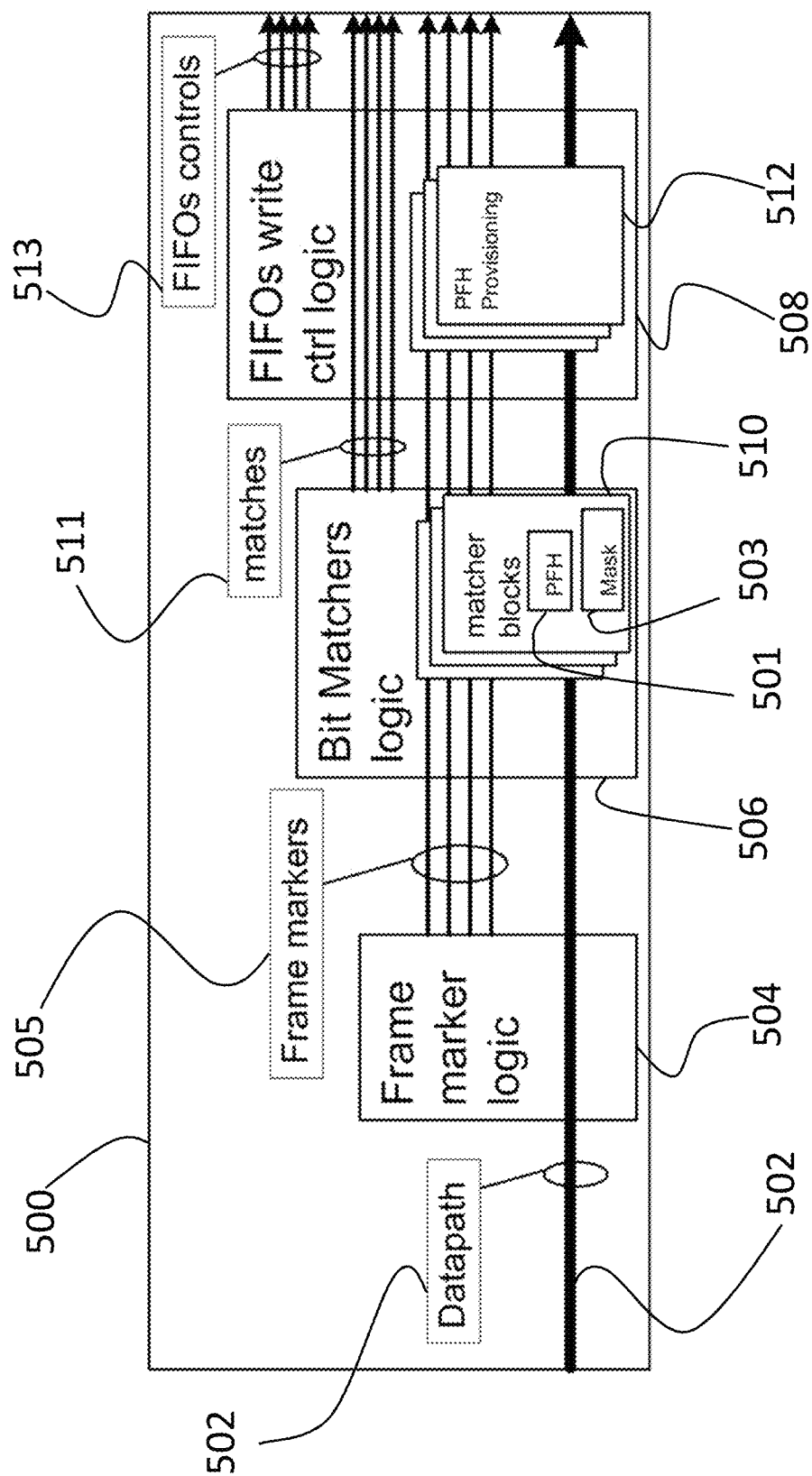
FIG. 5 is a logical block diagram of a filter according to the present disclosure.

Referring to FIG. 5, a logical diagram of a filter 500 on a datapath 502 is illustrated. The filters 412, 414, 500 perform three functions which work together to generate the signals needed to control and instrument the forwarding and loopback FIFOs of its respective LLB logic block. The three functions are frame marker logic 504, bit matcher logic 506 and FIFO write control logic 508.

The frame marker logic 506 delineates and detects the different fields of Layer 2 (Ethernet) and Layer 3+ (IP and above) OSI layers in units 401 of each Ethernet frame passing through the filter 500 on the datapath 502. This include fields such as Start Of Frame (SOF), End Of Frame (EOF), VLAN tag, VLAN stacking, Ethertype, Ethernet source address, Ethernet destination address, Ethernet payload, CRCs, IP source address, IP destination address. Frame marker logic 506 also recognizes and identifies different Ethernet types. Frame marker control signals 505 resulting from this field identification are passed forward to the bit matchers logic 506 and forward through the filter 500.

The bit matchers logic 506 compares incoming units 401 from the datapath 502 against mask templates. For each type of filter supported by the transceiver 400, there is an associated bit matcher block 510 inside the bit matchers logic 506. Each matcher block 510 includes PFHs 501 (provisioned frame headers) and associated "compare bit masks" 503 for the bits of each PFH 501. Each PFH 501 and compare bit mask 503 pair is programmable to provide flexible comparisons. The PFHs 501 may include fields programmed to match Layer 2 or Layer 3+ addresses and other various protocol fields. For example, to match all frames on a particular Ethernet Virtual Connection (EVC) a matcher block 510, its PFH 501 and its associated bit mask 503 may perform comparisons against the VLAN stacking and VLAN tag to identify the specific EVC. The PFH 501 will have its VLAN stacking and VLAN tag(s) set identically to any frames of the specific EVC. The mask 503 will have its comparison bits set to compare incoming data 502 to the PFH 501 at the bits associated with the VLAN stacking and VLAN tag(s) as identified by the frame marker logic 504.

Another EVC filter may mask and compare against a specific source or destination Ethernet address associated with the EVC. The combination of PFHs and compare bit masks for each matcher block 510 permits comparison and matching on any fields of any Ethernet frame. This also permits comparison and matching on fields of higher layer data such as IP addresses or class of service bits in layer 3 data.

In some embodiments, the comparison behaviors of bit matchers logic 506 may have default definitions by the manufacturer or a behavior determined by the end user through the use of the LLB protocol or other management protocols. "Provisioned" in PFH refers to PFH provisioning mechanism 512 of the LLB protocol for configuring the PFHs.

In operation, as a new Ethernet frame is received on datapath 502 and Start of Frame (SOF) is detected, the initial state of each matcher block 510 is set to "matched". It will remain in this "matched" state for as long as there is no mismatch found. The "compare bits mask" 503 indicates which bits of the PFHs 501 need to be compared and matched in order to remain in the "matched" state for that matcher block 510. The "matched" state of a matcher block 510 is lost when there is a mismatch between the bits of the received unit 401 and the PFH 501 and this mismatched happens on bits that were masked 503 for comparison. Match control signals 511 resulting from this analysis are passed to the FIFOs write control logic 508 and forward through the filter 500.

The FIFOs write control logic 508 uses the control signals 505, 511 from the frame marker logic 504 and the bit matchers logic 506 along with data provisioned 512 for the PFHs 501 to generate FIFO control signals 513 which control the write portion of the forwarding and loopback FIFOs. The FIFO write control logic 508 informs each FIFO that the current Ethernet frame from the datapath 502 is either ready to be transmitted or all units 401 associated with that Ethernet frame should be deleted (killed). It also indicates to the loopback FIFO how, and on which bytes of which units 401, an address swap could happen, if requested, at Layer 2 and Layer 3 such that looped back Ethernet frame will be properly addressed.

Some additional capabilities may be included inside the FIFOs write control logic 500 of EVC logic filters 412, 414 in some embodiments. For example, the ability to have an inverse function of the kill/transmit command sent to the two FIFOs. It is inversed in the sense that the EVC frames that were being looped back are now forwarded and the ones that were forwarded are now looped back. When some EVC loopbacks are configured in inverse mode while others are in forward mode, there may be a conflict between two matcher blocks 510 in different modes that both produce matches. To handle this scenario, each matcher block 510 may be assigned a decreasing priority. Using EVC LLB as an example, each EVC (and thereby, its associated matcher block 510) may be assigned a priority starting with EVC#0. EVC#0 has the highest priority, so if EVC#0 has a match for loopback and, for the same frame, EVC#1 also has a match but for the inverse mode (forwarding), EVC#0 has priority and the frame would be looped back.

In some embodiments, the LLB logic blocks 408, 410 include exception functionality to not loopback certain control frames such as service OAM frames and other specific control frames. In some embodiments, this is implemented in the bit matchers logic 506, matcher blocks 510 and/or PFHs 501. For example, some exceptions may be implemented as PFHs 501 and masks 503 in matcher blocks 510 having the highest priority.

The EVC filters logic 500 gives a unique, versatile and compact way of provisioning and matching different types of Ethernet frames including Layer 2 and higher layer data. These functions are versatile and can be used to support many other functions. The logic is also compact and makes very efficient use of memory logic and logic gates which are limited inside small devices such as pluggable transceivers. Versatility is achieved through the ability to match on any bits in the frame at full line rate while supporting other functions that utilize the match criteria. Compactness is achieved through the design of the blocks of the logic array 406 which is limited in size to fit within small pluggable devices where the logic gates and memory are limited.

Figure 6:
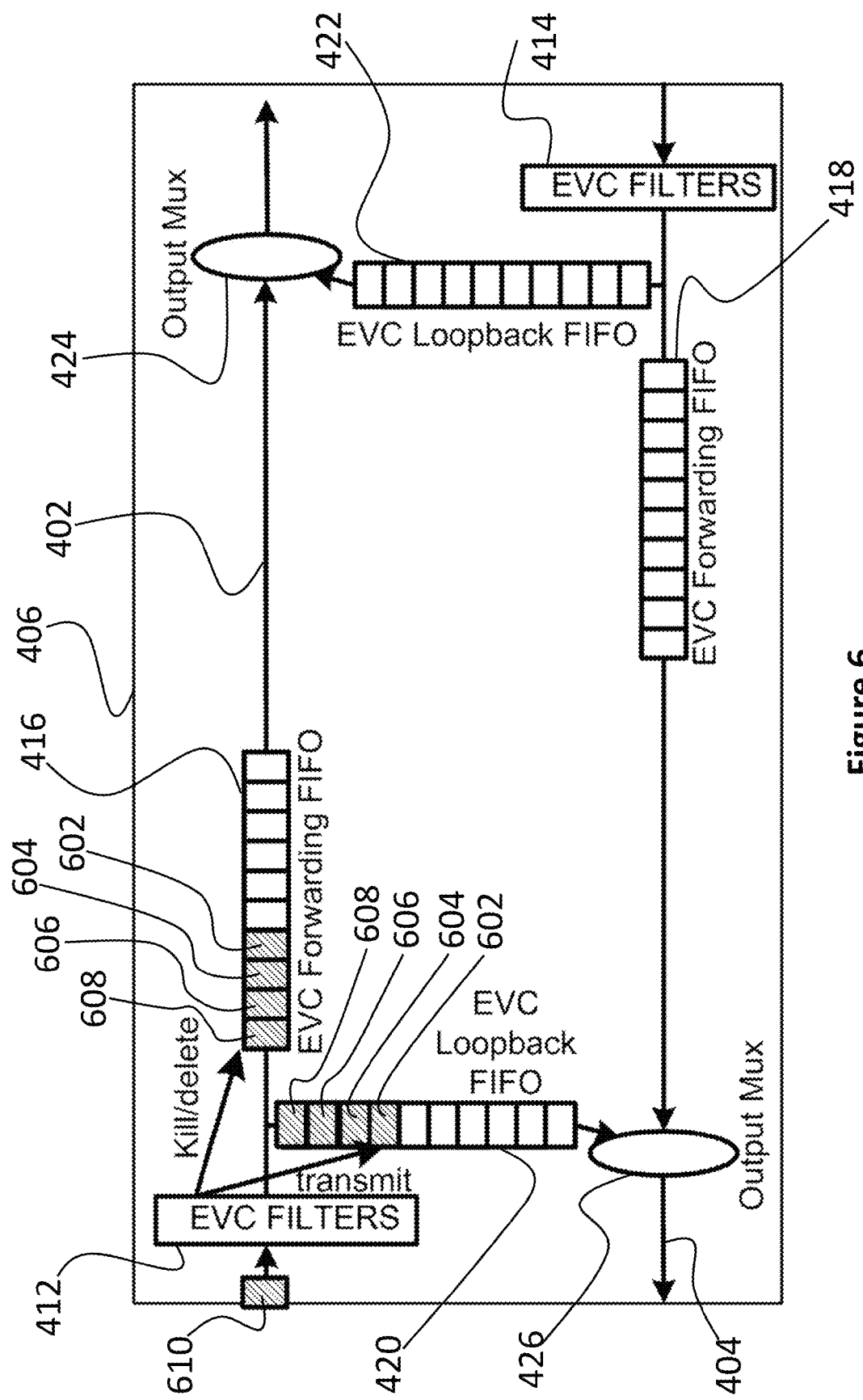
FIG. 6 is a logical block diagram illustrating the operation of the latching loopback functionality in a pluggable transceiver according to the present disclosure.

Referring now to FIG. 6, the operation of the FIFOs 416, 420 within logic array 406 when incoming units 602, 604, 606, 608, 610 associated with an incoming Ethernet frame on the downstream datapath 402 were received and written are now described.

In FIG. 6, The FIFOs 416, 418, 420, 422 are smart FIFOs, these are not regular FIFO (First In, First Out) memory buffers because not every unit 602, 604, 606, 608, 610 that goes in, goes out. One FIFO 420 is used to perform the loopback function while the other FIFO 416 is used to perform the forwarding function. The same functions occur on the opposite data path 404 for FIFOs 422 and 418, but only one side is describe for brevity. The pair of FIFOs 416 and 420 work in tandem to effect the per EVC service latching loopback functions 210. When a new Ethernet frame commences, each incoming unit 602, 604, 606, 608, 610 is being written to both FIFOs 416, 420 until enough of the Ethernet frame header is received for the EVC filter 412 to determine whether or not there is an EVC service match for that Ethernet frame. Based on this matching result, one of the 2 FIFOs will be allowed to transmit out all of the units 602, 604, 606, 608, 610 of the Ethernet frame while the same units 602, 604, 606, 608 stored in the other FIFO will be deleted (killed). In this manner the FIFOs 420, 422 enable Layer 2 latching loopback functionality; however the address fields of the looped-back Ethernet frame may still need to be swapped, if this optional feature is enabled.

Figure 7:
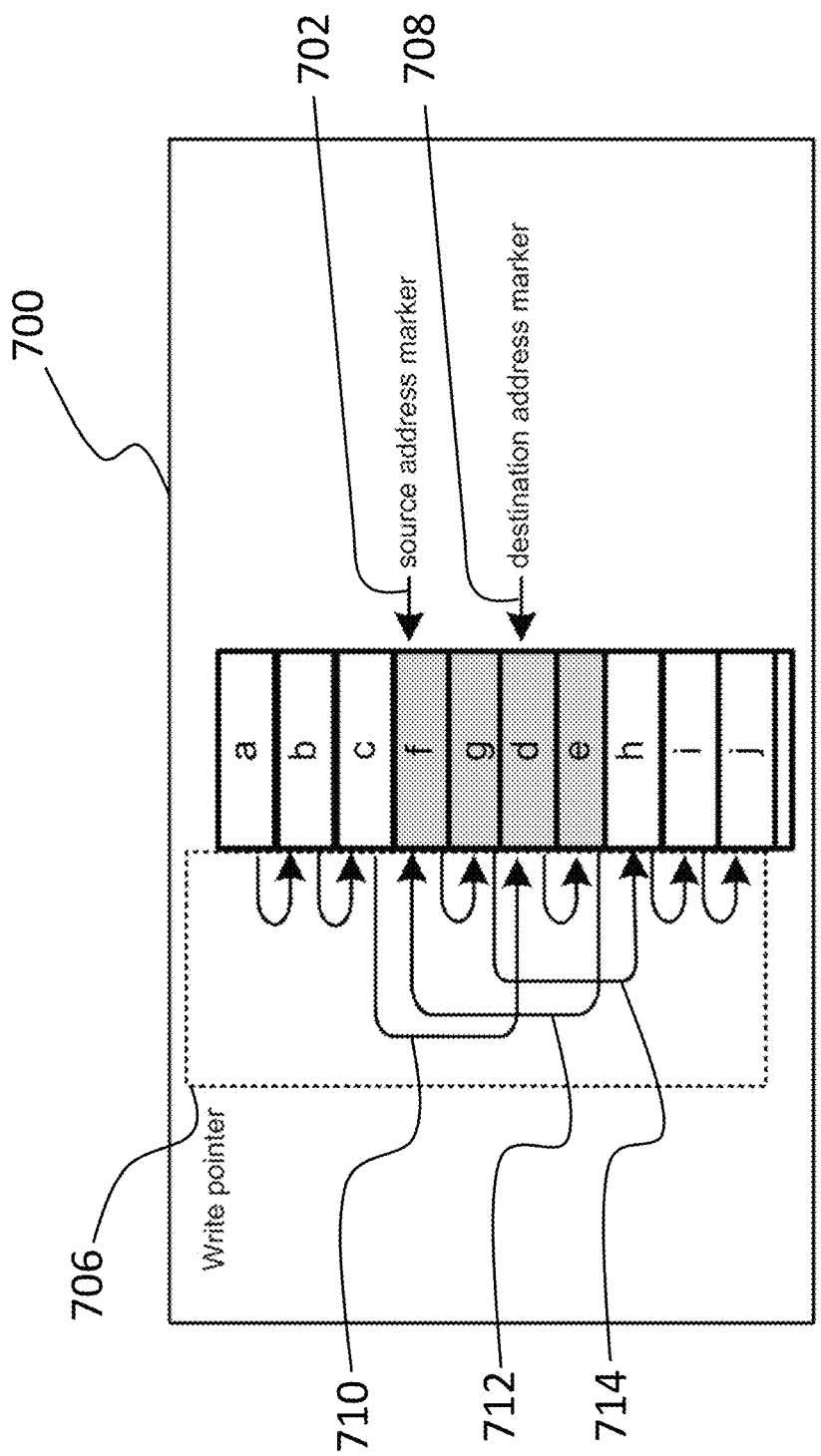
FIG. 7 is a block diagram illustrating a method for address swapping when writing to a loopback FIFO according to the present disclosure.

Referring now to FIG. 7, a method to perform address swapping while writing to a loopback FIFO is illustrated. Address swapping behavior is a configurable option which, if desired, can be set so that swapping addresses does not occur. In FIG. 7, the address swapping is performed as the Ethernet frame is being written to the loopback FIFO 700. Each letter a-j represents a byte in the loopback FIFO 700 that would normally be written sequentially into units 401 of the loopback FIFO 420, 422, 700 by incrementing the write pointer 706 one byte (or other information unit size) at a time. Bytes a-c from the incoming Ethernet frame are written to the loopback FIFO 700 in order until the write pointer 706 reaches the first byte of the source address marker 702 identified in the frame markers 505. At that point, the write pointer 706 jumps 710 to the destination address marker 708 location to write the source address bytes d and e into the destination address field. Then the write pointer 706 jumps 712 back to the source address marker 702 location to write the next bytes f and g (which hold the destination address) into the source address field, thereby swapping the addresses. Finally, the write pointer 706 jumps 714 to the first address after the destination address to continue writing bytes h, i and j sequentially as before the address swap. By shifting the write pointer 706 in the loopback FIFO 700 in this manner, it is possible to swap addresses without the need for additional buffers or latches.

Because Layer 2 and Layer 3 do not orient the source and destination addresses the same, the field markers applied in the address swapping method illustrated in FIG. 7 may also be flipped. Alternatively, the method in FIG. 7 may be applied to swap a first and second address in any data, rather than just a source and destination address as described. For example, in a Layer 4 data, ports may be swapped using the method in FIG. 7.

The loopback FIFO 420, 422, 700 is capable of swapping the Layer 2 Ethernet addresses as well as Layer 3 IP addresses. The EVC filters 412, 414, 500 provides all the information to perform the address swap function at Layer 2 or Layer 3+, including the source and destination address markers 702, 708 and the size of the addresses.

In some embodiments, the FIFOs may be implemented in memories to reduce the number of logic gates required to perform their functions. The address swap could be done during either the FIFO write or the FIFO read. Doing the swap during the FIFO write is more efficient in term of logic gates since the frame markers 505 and FIFO write control signals 511 were already generated by the EVC filters 412, 414. Not doing the address swap during the FIFO read or FIFO write function could increase the amount of logic gate required or make it very hard to achieve or maintain an effective line rate throughput for the transceiver 400.

Figure 8:
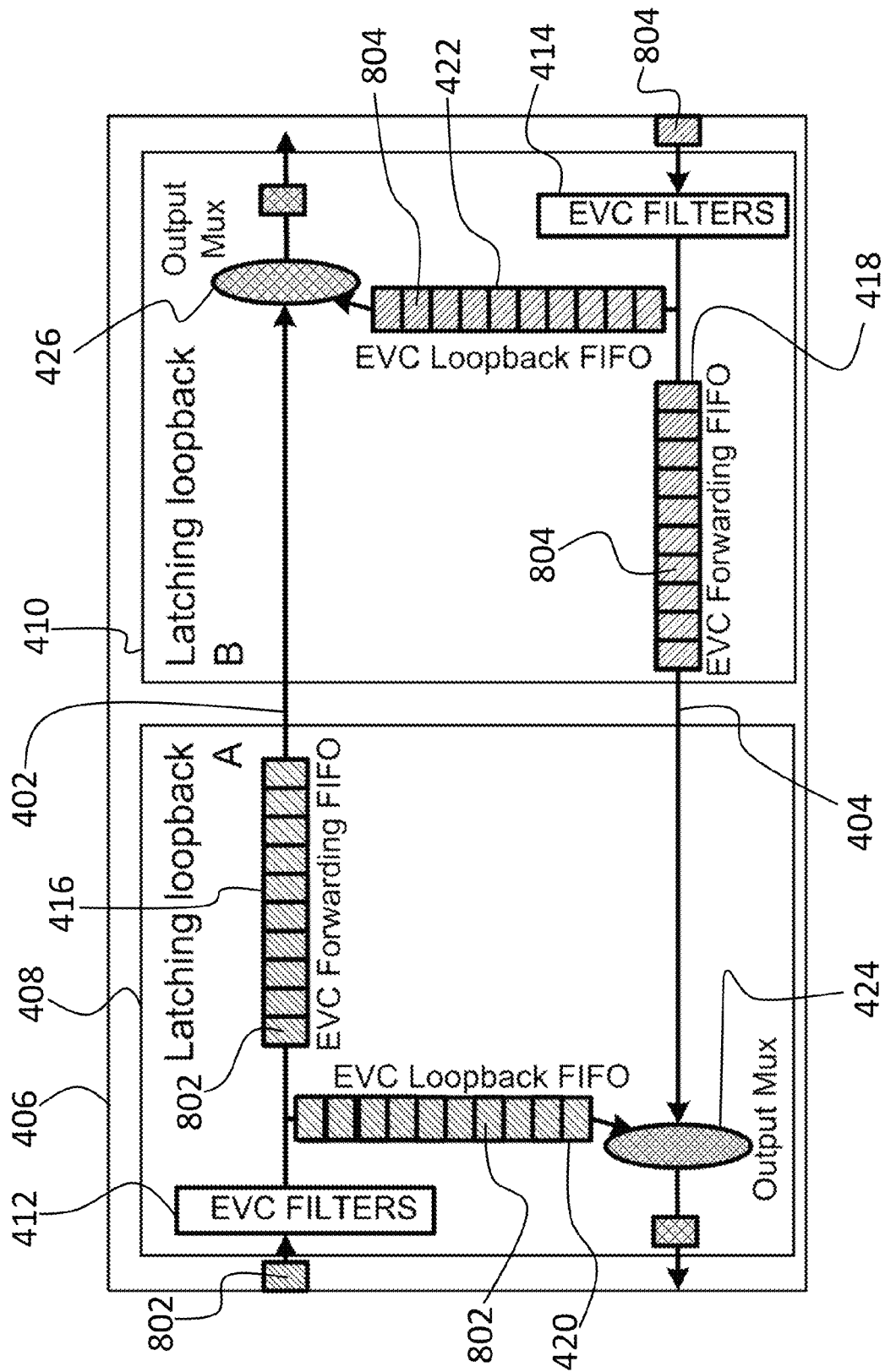
FIG. 8 is a logical block diagram illustrating the flow of units of an Ethernet frame in a pluggable transceiver according to the present disclosure.

Referring to FIG. 8, high-level operation of the output logic of the two latching loopback logic blocks 408, 410 is illustrated. The output logic 424, 426 schedules and multiplexes Ethernet frames 802, 804 to be sent by the transceiver 400 from its loopback FIFO 420, 422 or from the forwarding FIFO 416, 418 of the opposite direction LLB logic block 408, 410. For example, units of Ethernet frame 802 incoming to LLB logic block A 408 may be written into the forwarding FIFO 416 and/or loopback FIFO 420 of LLB logic block A 408. Units of Ethernet frame 804 incoming to LLB logic block B 410 may be written into forwarding FIFO 418 and/or loopback FIFO 422. The output multiplexer 424 of first LLB logic block A 408 schedules and multiplexes a combination of Ethernet frames 802 from loopback FIFO 420 and Ethernet frames 804 from forwarding FIFO 418. Similarly, the output multiplexor 426 of second LLB logic block B 410 schedules and multiplexes a combination of Ethernet frames 804 from loopback FIFO 422 and Ethernet frames 802 from forwarding FIFO 416. Units 401 of different Ethernet frames 802, 804 are not mixed by the output multiplexer logic 424, 426 as this would corrupt the Ethernet frames 802, 804.

Figure 9:
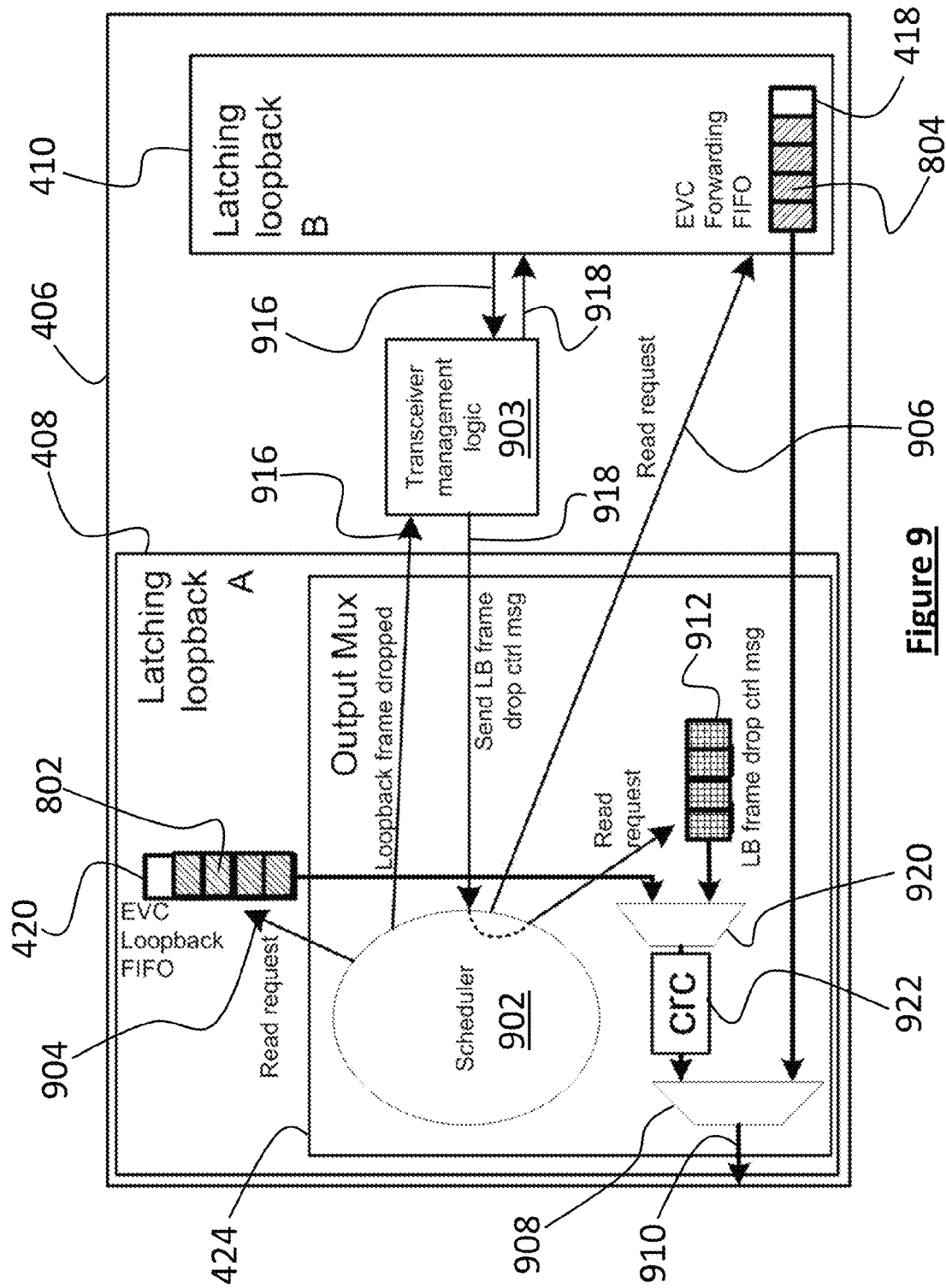
FIG. 9 is a logical block diagram of output multiplexer logic according to the present disclosure.

Referring now to FIG. 9, internal operation of the output multiplexer logic 424 is illustrated including how the output logic 424 manages oversubscription. Similar logic and functions as described below applies equally to output multiplexor 426.

In FIG. 9, the output multiplexor logic 424 schedules and multiplexes Ethernet frames 802, 804 to be sent from either the loopback FIFO 420 or from the forwarding FIFO 418 of the opposite direction LLB logic block B 410. A scheduler 902 manages read requests 904, 906 sent to the loopback FIFO 420 and the forwarding FIFO 424 of the opposite direction LLB logic block B 410. When operating under not-oversubscribed conditions, multiplexer 908 multiplexes Ethernet frames 802 and 804 from both of these FIFOs 420, 418 onto the outgoing datapath 910. When oversubscribed, or under any other condition where the scheduler 902 determines to halt loopback functionality, multiplexor 908 may be set to bypass all loopback Ethernet frames 802 to maintain required throughput of the transceiver 400.

Oversubscription during loopback may be an issue because two FIFOs 420, 418 are merged into one transmission line and the sum of the FIFO queue rates may exceed the transmission line rate. Since the one transmit line rate capacity is smaller than the sum of both received line rates, there is a chance that the one transmit output becomes oversubscribed while some loopback functions are enabled. In this scenario, the loopback frames 802 will be dropped by default giving the priority to frames 804 from the forwarding FIFOs 418. This is preferred practice so that the pluggable transceiver 400 may maintain its throughput requirements. When a frame 802 is dropped, the scheduler 902 informs the corresponding FIFO 420 and all units 401 of that frame 802 are deleted from the FIFO 420. In some embodiments, the LLB logic may be configured to give priority to looped back frames instead of forwarded frames to ensure that the loopback does not fail due to oversubscription. This is traffic affecting but advantageous when it is essential that a particular test being run receives all its loopback frames.

In some embodiments dropping loopback frames 802 due to oversubscription, a "loopback frame drop" control message 912 can be injected by the output multiplexor logic 424 and transmitted in either direction depending on how the transceiver 400 is configured. When the scheduler 902 decides to drop frames, a "loopback frame dropped" message 916 is sent to transceiver management logic 903. Transceiver management logic 903 selects which direction to send the loopback frame drop control message 912 and informs the necessary output multiplexer logic 424, 426 by sending it a "send loopback frame drop control message" message 918 to the respective LLB logic block 408, 410. When the scheduler 902 receives message 918 it prepares the appropriate "loop back frame dropped" message 912 and using a multiplexer 920, for example, injects the loopback frame drop control message 912 into the datastream 910.

The loopback frame drop control message 912 is useful to avoid a test falsely identifying oversubscription as network loss. If the loopback frames 802 are simply dropped by output multiplexer logic 424 without sending any control message, any loopback tests being run (that had looping back test frames 802 dropped) may have a false negative result. The control message 912 can indicate how many frames 802 were dropped due to oversubscription, allowing the device running the test, or generating the loopback data, to determine whether all, some or none of its missing frames 802, if any, were due to oversubscription or other causes, such as network loss.

The output multiplexer logic 424 may also include CRC regeneration logic 922. The "loop back frames dropped" control message 912 and any looped back Layer 2 Ethernet frames 802 which had addresses swapped may require the CRC checksum to be regenerated.

An example of filtering at a different OSI layer is a port latching loopback. In port latching loopback the PFH 501 and mask 503 are set so all frames through the filter 412, 414 match. In some embodiments (whether implementing port LLB, EVC LLB or otherwise), there may be exceptions in the filters 412, 414 to exclude specific frames from being looped back, for example service OAM frames, as described above. Because so much traffic is looped back in port LLB, oversubscription is a more frequent problem for the output logic 424, 426, accordingly, the traffic from the opposite direction is assigned a higher priority than the loopback traffic causing loopback traffic to be dropped should oversubscription occur. As previously described, control frames may be generated to identify when loopback traffic has been dropped.

Figure 10:
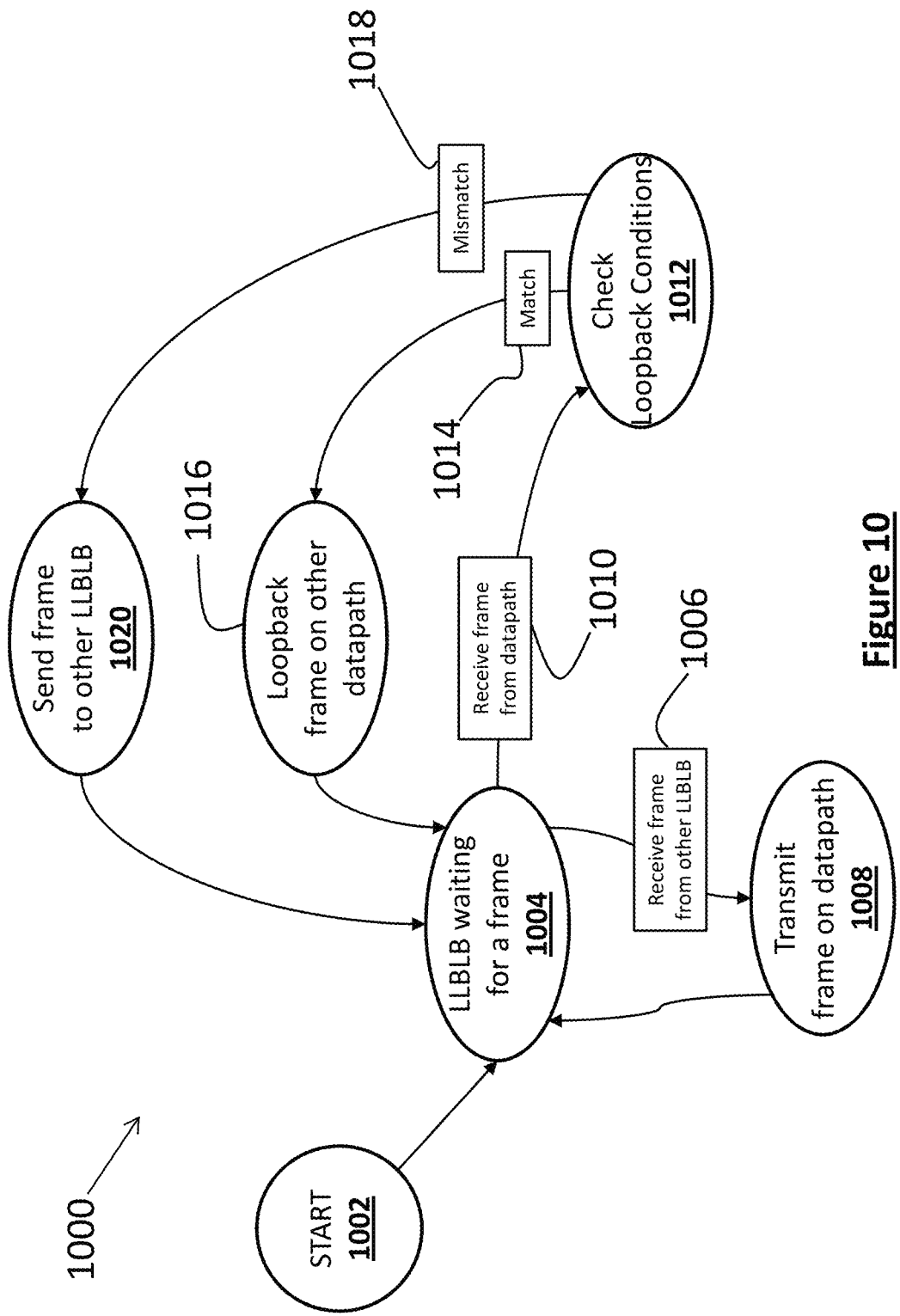
FIG. 10 is a logical flow diagram of a method of operation of a latching loopback logic block in a pluggable transceiver according to the present disclosure.

Referring now to FIG. 10, a method of operation 1000 of a latching loopback logic block (LLBLB) 408, 410 of a transceiver 208 is illustrated in a logical flow diagram. The method starts 1002 with the LLBLB waiting 1004 for a frame. A frame may arrive from its respective datapath 402, 404 or from the opposite LLBLB 408, 410 in the same logic array 406 of the transceiver 208. When the LLBLB 408, 410 receives 1006 a frame from the other LLBLB 408, 410, the LLBLB transmits 1008 the frame maintaining the direction that the frame was travelling. This reflects operation of the traditional transceiver 12 which relays frames from one end of its interface to the other within the necessary throughput requirements. Accordingly, the transmitting 1008 of the frame from the other LLBLB 408, 410 is often given priority over any looping back frames discussed next.

Returning to the LLBLB waiting 1004 for a frame, the LLBLB 408, 410 may receive 1010 a frame from its respective datapath. In this case, the LLBLB 408, 410 would check 1012 its loopback conditions to determine if the frame should be looped back. If the frame matches 1014 the loopback conditions, the LLBLB proceeds to loopback 1016 the frame on the other or opposite datapath from which it was received. Then the LLBLB returns to the state 1004 waiting for a frame.

Returning to the LLBLB checking 1012 loopback conditions, if the frame does not match any loopback conditions, a mismatch 1018 occurs and the LLBLB sends 1020 the frame to the other LLBLB for relay on the same datapath it was received. This is the transceiver 208 operating under non-loopback conditions in the manner in which transceiver 12 would relay frames. As before, the LLBLB returns to the state 1004 waiting for another frame.

Referring now to FIG. 11, another method of operation 1100 of an LLBLB 408, 410 of a logic array 406 of a pluggable transceiver 208 is illustrated in a logical flow diagram. This method 1100 commences at START 1102 where the LLBLB 408, 410 is waiting 1104 for a frame. As in method 1000, a frame may arrive from its respective datapath 402, 404 or from the opposite LLBLB 408, 410 in the same logic array 406 of the transceiver 208. As in method 1000, when the LLBLB 408, 410 receives 1006 a frame from the other LLBLB, the frame is transmitted 1008 on the datapath and the LLBLB 408, 410 returns to waiting 1104 for a frame.

When the LLBLB 408, 410 receives 1106 a frame from the datapath, the frame may arrive in portions comprising units 401 of the frame. From a single unit 401 it may not be possible to determine whether or not the whole frame will or will not match any loopback conditions. Accordingly, each unit 401 is copied 1108 to both the loopback FIFO and the forwarding FIFO of this LLBLB.

Next, the LLBLB checks 1110 the loopback conditions for each bit matcher block 510 to determine if the bit matcher blocks 510 maintain their "matched" state or yield a "mismatch". If a mismatch 1112 is identified, for example bits masked for comparison between the unit and a unit of the PFH do not match, the LLBLB sets 1114 the state of that matcher block 510 to "mismatched". In some embodiments, the LLBLB may thereafter skip the loopback conditions for that matcher block 510 as it can no longer yield a match on this frame.

Returning to state 1110, if a match 1116 is determined, for example no bits in the unit are masked for comparison or all bits masked for comparison in the unit match the bits of the corresponding unit of a PFH in one of the bit matcher blocks 510 then the LLBLB queries of the end of the frame or the end of the loopback conditions for this frame were detected 1118. If not, the LLBLB waits 1120 for the next unit of the frame where after it returns to state 1108 and repeats the process.

If the LLBLB in state 1118 detects 1118 the end of the frame or the end of the loopback conditions, the LLBLB queries if at least one matcher block 510 remains in the matched state 1122. If not the LLBLB deletes 1124 all units of the frame already copied into the loopback FIFO from the loopback FIFO because this frame is not a loopback frame. The frame remains in the forwarding FIFO and will be sent 1020 to the other LLB and transmitted as previously described. The LLBLB then returns to waiting 1104 for another frame.

Returning to state 1122 if the query that at least one matcher block 510 remained in the matched state is true, then the frame, including all units already processed and any further units not yet processed should be looped back 1016 via the loopback FIFO. Accordingly, the LLBLB 408, 410 deletes 1126 all units 401 of the frame already copied into the forwarding FIFO, loops back 1016 the frame on the other data path as previously described and returns to waiting 1104 for another frame.

If multiple matches remain when the LLB is in state 1122, prioritization may determine which loopback takes priority.

In some embodiments, the default prioritization of frames in output multiplexor logic 424, 426 (see FIG. 9) can be changed. The default priority favors the forwarding FIFOs 416, 418; but this can be changed for specific test purposes by re-provisioning the output multiplexor logic 424, 426.

In some embodiments, one of the two latching loopback logic blocks may be omitted. Although this is less than ideal, it is possible for a transceiver to include LLB logic that filters only one datapath, forwards on that data path and loopbacks on the other data path while packets on the other data path are not filtered or looped back.

Where the present disclosure has provided description and examples in the context of looping back Ethernet frames, the present disclosure is readily adapted to higher layer data including IP packets (layer 3), segments or datagrams (layer 4) and data at higher layers. The bit matcher logic would also include PFHs and bit matcher logic for these types of higher level data.

Where any claim enumerates elements or actions (alphabetically, numerically or otherwise), these enumerations are provided for identification purposes only and do not imply any order of actions. The order of actions in a claim having enumerated actions (alphabetically, numerically, or otherwise) is determined by the language of the claims as informed by the specification, and not by the enumeration order of those actions.

We claim:

1. A method for using a pluggable transceiver in a network element of an Ethernet network for looping back frames, the transceiver having an upstream datapath, a downstream datapath and a logic array having a first latching loopback logic block (LLBLB) and a second LLBLB connected in series through both the upstream and downstream datapaths, the method comprising:
   (a) receiving, in the first LLBLB, a frame from the downstream datapath;
   (b) comparing, in the first LLBLB, the frame from (a) to first loopback conditions yielding a match or a mismatch;
   (c) in response to (b) yielding a mismatch, sending, in the first LLBLB, the frame from (b) to the second LLBLB;
   (d) in response to (b) yielding a match, looping back, in the first LLBLB, the frame from (b) on the upstream datapath if there is available bandwidth on the upstream datapath;
   (e) receiving, in the first LLBLB, a frame from the second LLBLB;
   (f) transmitting, in the first LLBLB, the frame from (e) on the upstream datapath;
   (g) receiving, in the second LLBLB, a frame from the upstream datapath;
   (h) comparing, in the second LLBLB, the frame from (g) to second loopback conditions yielding a match or a mismatch;
   (i) in response to (h) yielding a mismatch, sending, in the second LLBLB, the frame from (h) to the first LLBLB; and
   (j) in response to (h) yielding a match, looping back, in the second LLBLB, the frames from (h) on the downstream datapath if there is available bandwidth on the downstream datapath;
   (k) receiving a frame, in the second LLBLB, from the first LLBLB;
   (l) transmitting, in the second LLBLB, the frame from (k) on the downstream datapath.

2. The method of claim 1 wherein:
   (a) further comprises receiving the frame from the downstream datapath unit by unit; and
   (b) further comprises comparing the successively received units of the frame received from (a) to successive units of the first loopback conditions.

3. The method of claim 2 wherein comparing the successively received units of the frame received from (a) to successive units of the first loopback conditions comprises:
   masking for comparison bits of the next unit of the frame and bits of a next unit of a provisioned frame header (PFH);
   yielding a mismatch when the bits masked for comparison do not match;
   repeating the comparing on subsequent units while the bits masked for comparison match and there are more units of the frame and the PFH;
   yielding a match when there are no more units of the frame or no more units of the PFH and no mismatch was yielded.

4. The method of claim 2 wherein (a) further comprises copying each unit to both a forwarding FIFO and a loopback FIFO; and wherein (b) further comprises deleting the units from the forwarding FIFO when comparing yields a match and deleting the units from the loopback FIFO when comparing yields no matches.

5. The method of claim 1 wherein (d) further comprises swapping the address fields of the frame for looping back.

6. The method of claim 5 wherein (d) further comprises recalculating the CRC checksum after swapping the address fields.

7. The method of claim 1 wherein (d) further comprises deleting the frame from (b) if there is insufficient bandwidth on the upstream datapath.

8. The method of claim 7 wherein (d) further comprises transmitting a loopback frame drop message on the upstream or downstream datapath in response to deleting the frame from (b).

9. The method of claim 1 further comprising prioritizing (f) over (d) and (l) over (j) to maintain data throughput requirements of the pluggable transceiver on the upstream and downstream datapaths respectively.

10. The pluggable transceiver of claim 1 wherein the output logic comprises a scheduler for deleting the frame from the downstream datapath if there is insufficient bandwidth on the upstream datapath.

11. The pluggable transceiver of claim 10 wherein the logic array further comprises transceiver management logic for instructing the transmitting a loopback frame drop message on the upstream or downstream datapath in response to the scheduler deleting the frame for looping back.

12. The pluggable transceiver of claim 10 wherein the scheduler comprises prioritization logic for prioritizing transmitting the frame from the second LLBLB on the upstream datapath over looping back the frame from the downstream datapath on the upstream datapath to maintain an upstream data throughput requirement of the pluggable transceiver.

13. A pluggable transceiver for use in a network element of an Ethernet network for looping back frames, the transceiver comprising:
   a downstream datapath for relaying frames downstream through the transceiver;
   an upstream datapath for relaying frames upstream through the transceiver;
   a logic array connected through the upstream and downstream datapaths and comprising a first latching loopback logic block (LLBLB) and a second LLBLB connected in series through both the upstream and downstream datapaths;
   the first LLBLB having filter logic for receiving a frame from the downstream datapath; and comparing the frame from the downstream datapath to first loopback conditions yielding a match or a mismatch;
   the first LLBLB having a forwarding FIFO for sending the frame from the downstream datapath to the second LLBLB in response to the first LLBLB's filter logic yielding a mismatch;
   the first LLBLB having a loopback FIFO for looping back the frame from the downstream datapath on the upstream datapath if there is available bandwidth on the upstream datapath, in response to the first LLBLB's filter logic yielding a match;
   the first LLBLB having output logic for receiving a frame from the second LLBLB and transmitting the frame from the second LLBLB on the upstream datapath;
   the second LLBLB having a filter logic for receiving a frame from the upstream datapath and comparing the frame from the upstream datapath to second loopback conditions yielding a match or a mismatch;

the second LLBLB having a forwarding FIFO for sending the frame from the upstream datapath to the first LLBLB in response to the second LLBLB's filter logic yielding a mismatch;

the second LLBLB having a loopback FIFO for looping back the frames from the upstream datapath on the downstream datapath if there is available bandwidth on the downstream datapath, in response to the second LLBLB's filter logic yielding a match; and the second LLBLB having an output logic for receiving a frame from the first LLBLB and transmitting the frame from the first LLBLB on the downstream datapath.

14. The pluggable transceiver of claim 13 wherein the first LLBLB's filter logic comprises:

further logic for receiving the frame from the downstream datapath unit by unit; and bit matchers logic for comparing the successively received units of the frame received from the downstream datapath to successive units of the first loopback conditions.

15. The pluggable transceiver of claim 14 wherein the bit matchers logic further comprises:

a provisioned frame header (PFH) having units for comparing to units of the frame from the downstream datapath;

a bit comparison mask for masking for comparison bits of a next unit of the frame and bits of a next unit of the PFH;

wherein the bit matchers logic yields a mismatch when the bits of the next unit of the frame and the next unit of the PFH masked by the bit comparison mask do not match;

wherein the bit matchers logic repeats the comparing on subsequent units while the next units for the frame and the PFH match under the bit comparison mask and there are more units of the frame and the PFH; and wherein the bit matchers logic yields a match when there are no more units of the frame or no more units of the PFH and no mismatch was yielded under the bit comparison mask.

16. The pluggable transceiver of claim 13 wherein the loopback FIFO of the first LLBLB comprises further logic for swapping address fields of a frame for looping back.

17. The pluggable transceiver of claim 16 wherein the output logic comprises further logic for recalculating the CRC checksum.

* * * * *